US010672925B2

(12) United States Patent
Chiang et al.

(10) Patent No.: US 10,672,925 B2
(45) Date of Patent: Jun. 2, 2020

(54) THIN FILM SOLAR CELL AND METHOD OF FORMING SAME

(71) Applicant: TSMC Solar Ltd., Taichung (TW)

(72) Inventors: Chi-Yu Chiang, Taoyuan (TW); Yung-Sheng Chiu, Fuxing Township (TW); Wen-Tsai Yen, Caotun Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 532 days.

(21) Appl. No.: 13/917,675

(22) Filed: Jun. 14, 2013

(65) Prior Publication Data

US 2014/0366935 A1 Dec. 18, 2014

(51) Int. Cl.
*H01L 31/0224* (2006.01)
*H01L 31/18* (2006.01)
*H01L 31/0463* (2014.01)
*H01L 31/0749* (2012.01)

(52) U.S. Cl.
CPC .. *H01L 31/022466* (2013.01); *H01L 31/0463* (2014.12); *H01L 31/0749* (2013.01); *H01L 31/1884* (2013.01); *Y02E 10/541* (2013.01)

(58) Field of Classification Search
CPC ......... H01L 31/1884; H01L 31/022466; H01L 31/0463; H01L 31/0749
See application file for complete search history.

(56) References Cited

U.S. PATENT DOCUMENTS

| 2009/0145472 A1* | 6/2009 | Li | H01L 31/03923 136/244 |
| 2009/0227090 A1* | 9/2009 | Myong | C23C 14/086 438/475 |
| 2010/0184249 A1* | 7/2010 | Chen | H01L 31/02963 438/72 |
| 2010/0186815 A1* | 7/2010 | Yang | H01L 31/022466 136/256 |
| 2011/0197967 A1 | 8/2011 | Kaijo et al. | |

FOREIGN PATENT DOCUMENTS

| CN | 102187472 A | 9/2011 |
| CN | 102623569 A | 8/2012 |

OTHER PUBLICATIONS

Jean Rousset et al., High efficiency cadmium free Cu(In, Ga)Se2 thin film solar cells terminated by an electrodeposited front contact, Solar Energy Materials & Solar Cells 95 (2011), 1544-1549.*
Byeong-Yun Oh, Post-annealing of Al-doped ZnO films in hydrogen atmosphere, Journal of Crystal Growth 281 (2005) 475-480.*

(Continued)

*Primary Examiner* — Shannon M Gardner
(74) *Attorney, Agent, or Firm* — Duane Morris LLP

(57) ABSTRACT

A solar cell device with improved performance and a method of fabricating the same is described. The solar cell includes a back contact layer formed on a substrate, an absorber layer formed on the back contact layer, a buffer layer formed on the absorber layer, and a front contact layer formed by depositing a transparent conductive oxide layer on the buffer layer and annealing the deposited TCO layer.

20 Claims, 8 Drawing Sheets

(56) References Cited

OTHER PUBLICATIONS

Rousset,J. et al., "High efficiency CIGS-based solar cells with electrodeposited ZnO:Cl as transparent conducting oxide front contact", Prog. Photovolt: Res. Appl., 2011, 19:537-546.
Official Action dated Jul. 19, 2017 in corresponding Chinese Patent Application No. 2017607140156620.
Delahoy, A.E. et al., "New technologies for CIGS photovoltaics", Solar Energy, 2004, 77(6):785-793.
Wang, Z.A. et al., "Growth of ZnO:Al films by RF sputtering at room temperature for solar cell applications", Solid-State Electronics, 2009, 53(11):1149-1153.

\* cited by examiner

THIN FILM SOLAR CELL AND METHOD OF FORMING SAME

TECHNICAL FIELD

The disclosure relates to thin film photovoltaic solar cells and methods of fabricating the same. More particularly, the disclosure relates to solar cell substructures, such as those including transparent conductive oxide films, with improved device performance and methods of fabricating the same.

BACKGROUND

Solar cells are electrical devices for direct generation of electrical current from sunlight by the photovoltaic (PV) effect. A plurality of solar cells can be connected in series by respective interconnect structures to form a solar cell module. A plurality of modules can be connected to form an array. Solar cells include absorber layers that absorb the sunlight that is converted into electrical current.

Due to the growing demand for clean sources of energy, the manufacture of solar cell devices has expanded dramatically in recent years and continues to expand. Various types of solar cells and solar cell substructures exist and continue to be developed. Some types of solar cell devices include a layer of transparent conductive oxide (TCO) material forming a window for light to pass through to active layers below. TCO materials generally include optically transparent and electrically conductive materials. However, there is a trade-off between transmittance and resistance properties for TCO materials, e.g., materials with high transmittance also have high resistance (i.e., low conductivity). This trade-off limits the effectiveness of TCO layers in photovoltaic devices because applications to improve the electrical conductivity of the layer often degrade the optical transmittance of the layer.

BRIEF DESCRIPTION OF THE DRAWING

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like numerals denote like features throughout the specification and drawing.

DETAILED DESCRIPTION

Figure 1:
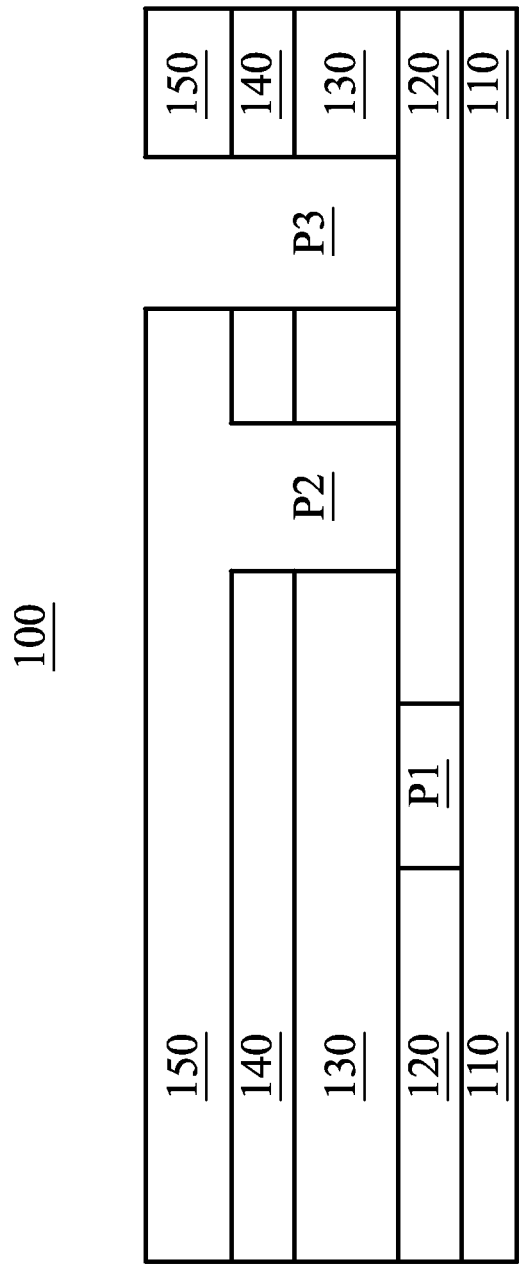
FIG. 1 is a cross-section of an embodiment of a solar cell described herein.

In the description, relative terms such as "lower," "upper," "horizontal," "vertical," "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The disclosure provides for improved substructures for photovoltaic solar cell devices and methods for fabricating the devices and substructures. In particular, the disclosure provides for an easily controllable and stable formation of higher quality transparent conductive oxide (TCO) films with significantly improved conductivity without a degradation in transmittance. An overview of the various solar cell substructures according to the disclosure is provided in FIG. 1. Further details of the method and structures formed according to the methods are provided in conjunction with the accompanying figures. The descriptions of the exemplary embodiments is intended to be read in connection with the figures of the accompanying drawing, which are to be considered part of the entire written description.

In accordance with some embodiments, FIG. 1 shows a cross-section of a solar cell 100. The solar cell 100 includes a substrate 110, a back contact layer 120, an absorber layer 130 on the back contact layer 120, a buffer layer 140 on the absorber layer 130, and a front contact layer 150 above the buffer layer 140. The solar cell 100 can also include interconnect structures comprising three scribe lines, referred to as P1, P2 and P3. The P1 scribe line extends through the back contact layer 120 and is filled with the absorber layer material 130. The P2 scribe line extends through the buffer layer 140 and the absorber layer 130 and is filled with the front contact layer material 150. The P3 scribe line extends through the front contact layer 150, buffer layer 140 and absorber layer 130.

The substrate 110 comprises any suitable substrate material, such as glass. In some embodiments, the substrate 110 can include a glass substrate, such as soda lime glass, or a flexible metal foil or polymer (e.g., a polyimide, polyethylene terephthalate (PET), polyethylene naphthalene (PEN)). Other embodiments include still other substrate materials.

The back contact layer 120 comprises any suitable back contact material, such as metals. In some embodiments, the back contact layer 120 can include molybdenum (Mo), platinum (Pt), gold (Au), silver (Ag), nickel (Ni), or copper (Cu). Other embodiments include still other back contact materials.

The absorber layer 130 comprises any suitable absorber material, such as p-type semiconductors. In some embodiments, the absorber layer 130 can include a chalcopyrite-based material comprising $Cu(In,Ga)Se_2$ (CIGS), cadmium telluride (CdTe), $CuInSe_2$ (CIS), $CuGaSe_2$ (CGS), $Cu(In,Ga)Se_2$ (CIGS), $Cu(In,Ga)(Se,S)_2$ (CIGSS), CdTe or amorphous silicon. Other embodiments include still other absorber materials.

The buffer layer 140 comprises any suitable buffer material, such as n-type semiconductors. In some embodiments, the buffer layer 140 can include cadmium sulphide (CdS), zinc sulphide (ZnS), zinc selenide (ZnSe), indium(III) sulfide ($In_2S_3$), indium selenide ($In_2Se_3$), or $Zn_{1-x}Mg_xO$, (e.g., ZnO). Other embodiments include still other buffer materials.

The front contact layer 150 comprises an annealed TCO layer. The TCO material for the annealed TCO layer can include any suitable front contact material, such as metal oxides and metal oxide precursors. In some embodiments, the TCO material can include zinc oxide (ZnO), cadmium oxide (CdO), indium oxide ($In_2O_3$), tin dioxide ($SnO_2$), tantalum pentoxide ($Ta_2O_5$), gallium indium oxide ($GaInO_3$), ($CdSb_2O_3$), or indium oxide (ITO). The TCO material can also be doped with a suitable dopant. In some embodiments, ZnO can be doped with any of aluminum (Al), gallium (Ga), boron (B), indium (In), yttrium (Y), scandium (Sc), fluorine (F), vanadium (V), silicon (Si), germanium (Ge), titanium (Ti), zirconium (Zr), hafnium (Hf), magnesium (Mg), arsenic (As), or hydrogen (H). In other embodiments, $SnO_2$ can be doped with antimony (Sb), F, As, niobium (Nb), or tantalum (Ta). In other embodiments, $In_2O_3$ can be doped with tin (Sn), Mo, Ta, tungsten (W), Zr, F, Ge, Nb, Hf, or Mg. In other embodiments, CdO can be doped with In or Sn. In other embodiments, $GaInO_3$ can be doped with Sn or Ge. In other embodiments, $CdSb_2O_3$ can be doped with Y. In other embodiments, ITO can be doped with Sn. Other embodiments include still other TCO materials and corresponding dopants.

The front contact layer 150 performs a conductive function while being light transparent. To reduce the resistance of a solar cell, one can increase the dopant concentration in the TCO layer and/or apply ultraviolet or microwave radiation during deposition of the TCO layer. Either technique can improve conductivity, but also decreases the transmittance of the TCO layer. A reduction in transmittance of the TCO layer in turn reduces the amount of energy which reaches the absorber layer, so less energy is available for conversion to electricity. Conversely, eliminating or decreasing these techniques provides better transmittance, but increases the resistance (thus reducing efficiency). The properties of the front contact layer 150 are significantly improved by the annealed TCO layer described herein. In particular, the solar cell 100 and methods of fabricating the solar cell 100 increase the conductivity of the front contact layer 150 without degrading transmittance, resulting in improved solar cell device performance.

Figure 2:
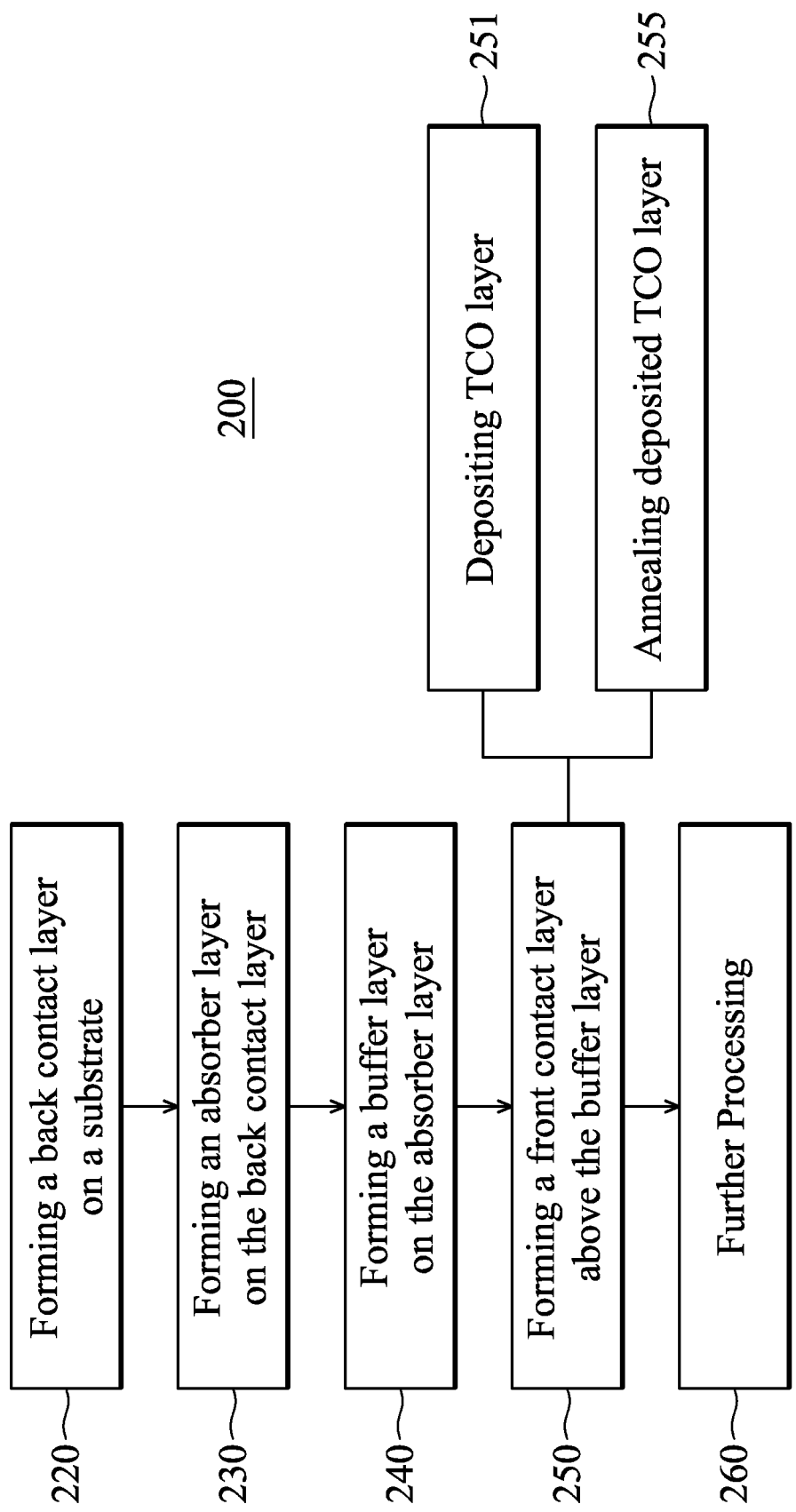
FIG. 2 is a flow chart of a method of fabricating a solar cell as shown and described herein.

FIG. 2 shows a flowchart describing a broad method 200 for fabricating a solar cell including the annealed TCO layer. At step 220, a back contact layer is formed on a substrate. At step 230, an absorber layer is formed on the back contact layer. At step 240, a buffer layer is formed on the absorber layer. At step 250, a front contact layer is formed above the buffer layer. Forming the front contact layer can include depositing a TCO layer at step 251. In some embodiments, the TCO layer can be formed using thin film deposition techniques, such as atomic layer deposition (ALD) and chemical vapor deposition (CVD), including atmospheric pressure CVD (APCVD), plasma-enhanced CVD (PECVD), and metal organic CVD (MOCVD).

At step 255, the deposited TCO layer is annealed. In some embodiments at step 260, the solar cell can undergo additional processing operations and can be coupled to other solar cells to form solar modules. For example, further processing may include scribing, EVA/butyl applications, lamination, back end processing, and module formation. Solar modules can in turn be coupled to other solar modules in series or in parallel to form an array. Further details of the method and application of steps 220-260 are provided in this description and the accompanying figures.

Figure 3A:
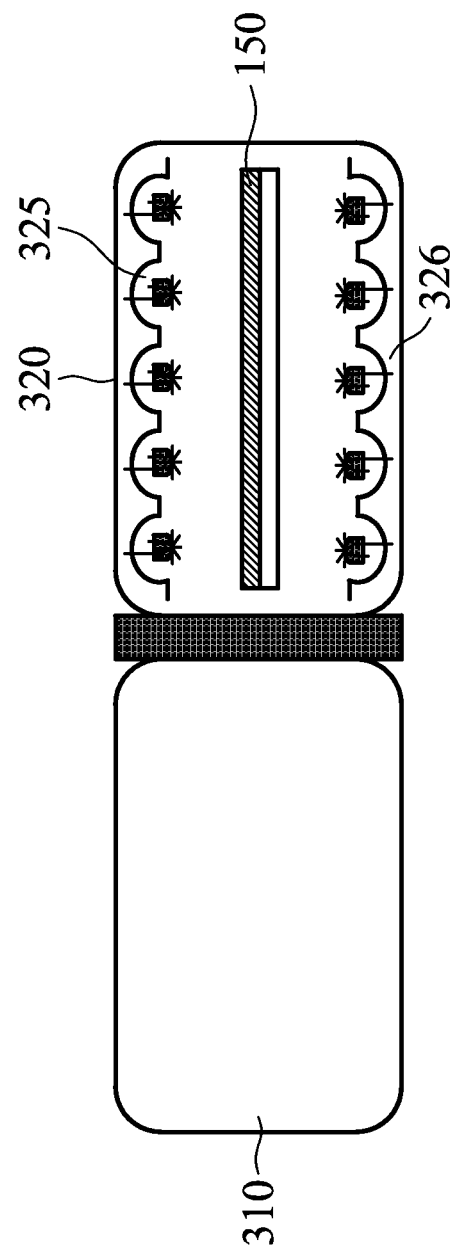
FIG. 3A is a schematic of deposition and annealing chambers for fabricating a solar cell as shown and described herein.
Figure 3B:
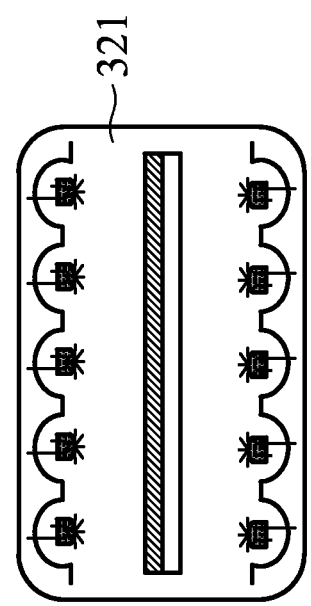
FIG. 3B is a schematic of a single in-line chamber for fabricating a solar cell as shown and described herein.

The annealing of the deposited TCO layer in step 255 can be performed in an annealing chamber 320/321. In some embodiments as shown in FIG. 3A, the annealing chamber 320 can be separate from a deposition chamber 310, where the TCO layer deposition occurs. In other embodiments as shown in FIG. 3B, the deposition and annealing chambers can be combined in-line to form a single chamber 321.

In some embodiments, the annealing chamber 320/321 can include an upper heat source 325, a lower heat source 326, or both. In some embodiments, the annealing temperature for the TCO layer can be about 60° C. or more, 75° C. or more, 80° C. or more, 85° C. or more, 90° C. or more, 100° C. or more, 125° C. or more, and 150° C. or more. In other embodiments, the annealing temperature for the TCO layer can be about 300° C. or less, 250° C. or less, 200° C. or less, 175° C. or less, 150° C. or less, and 100° C. or less. In other embodiments, the annealing temperature can range between a combination of the foregoing. For example, ranging from about 60° C. to 300° C., 80° C. to 300° C., 100° C. to 200° C., 80° C. to 200° C., and 80° C. to 150° C. As used herein, the term "about" with respect to temperature is intended to include minor deviations therefrom. For example, deviations of plus or minus 1 degree, or plus or minus 2 degrees, or plus or minus 5 degrees.

In some embodiments, the annealing time for the TCO layer can be about 10 minutes (min) or more, 13 min or more, 15 min or more, 20 min or more, and 30 min or more. In other embodiments, the annealing time for the TCO layer can be about 1 hour or less, 50 min or less, 45 min or less, 30 min or less, 25 min or less, and 15 min or less. In other embodiments, the annealing time can range between a combination of the foregoing. For example, ranging from about 10 min to 1 hour, 10 min to 30 min, 15-50 min, and 10-15 min. As used herein, the term "about" with respect to time is intended to include minor deviations therefrom. For example, deviations of plus or minus 1 minute, or plus or minus 5 minutes. Deviations may be greater for longer periods of time (e.g., greater than 30 minutes), for example, plus or minus 5 minutes, or plus or minus 10 minutes.

In some embodiments, the TCO layer can be annealed under a controlled atmosphere. For example, annealing can occur under a controlled atmosphere of a reactive gas, such as hydrogen gas ($H_2$). In other embodiments, the TCO layer can be annealed in a vacuum environment, or in an inert gas, such as nitrogen ($N_2$) or a noble gas.

Figure 4:
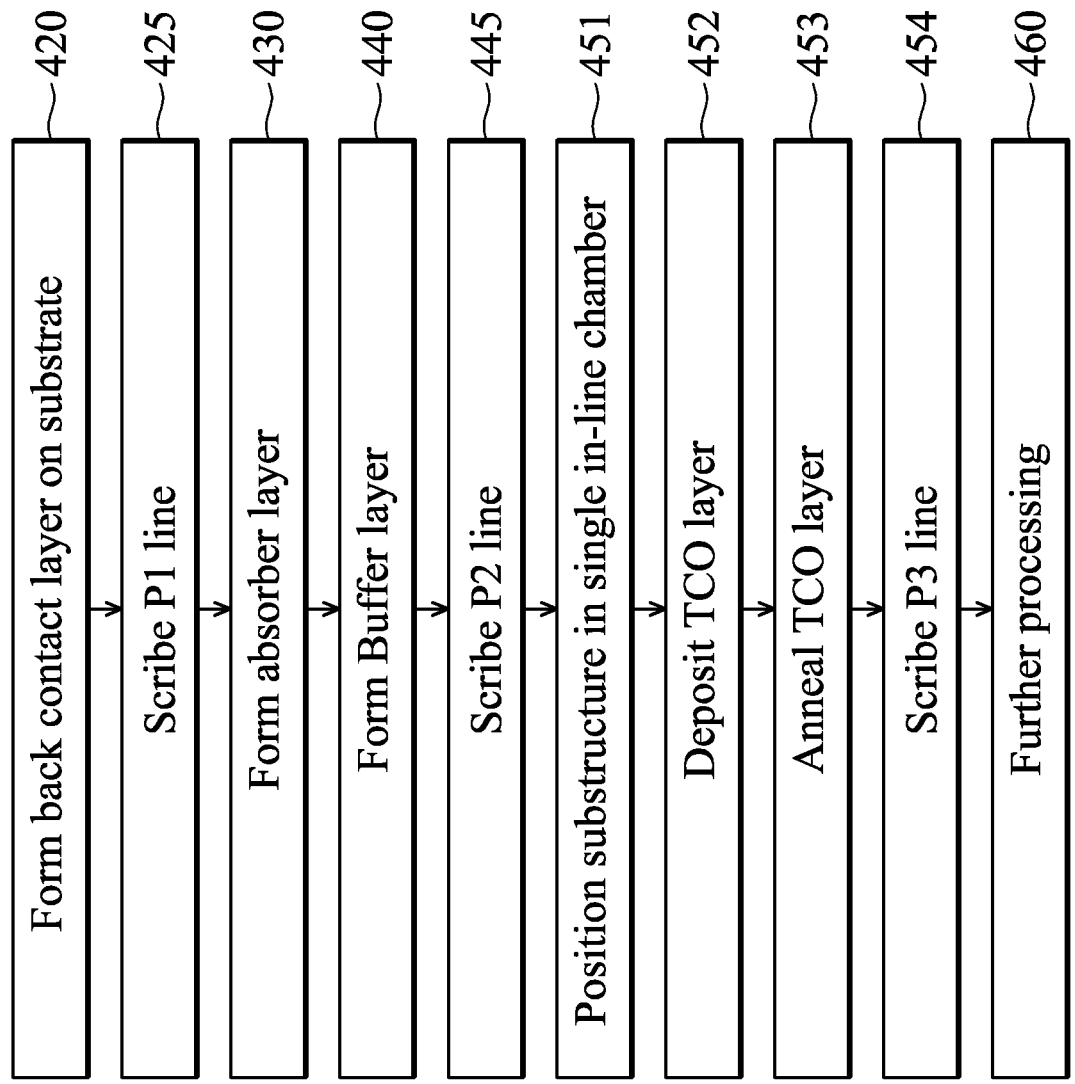
FIG. 4 is a flow chart of a method of fabricating a solar cell as shown and described herein.
Figure 5:
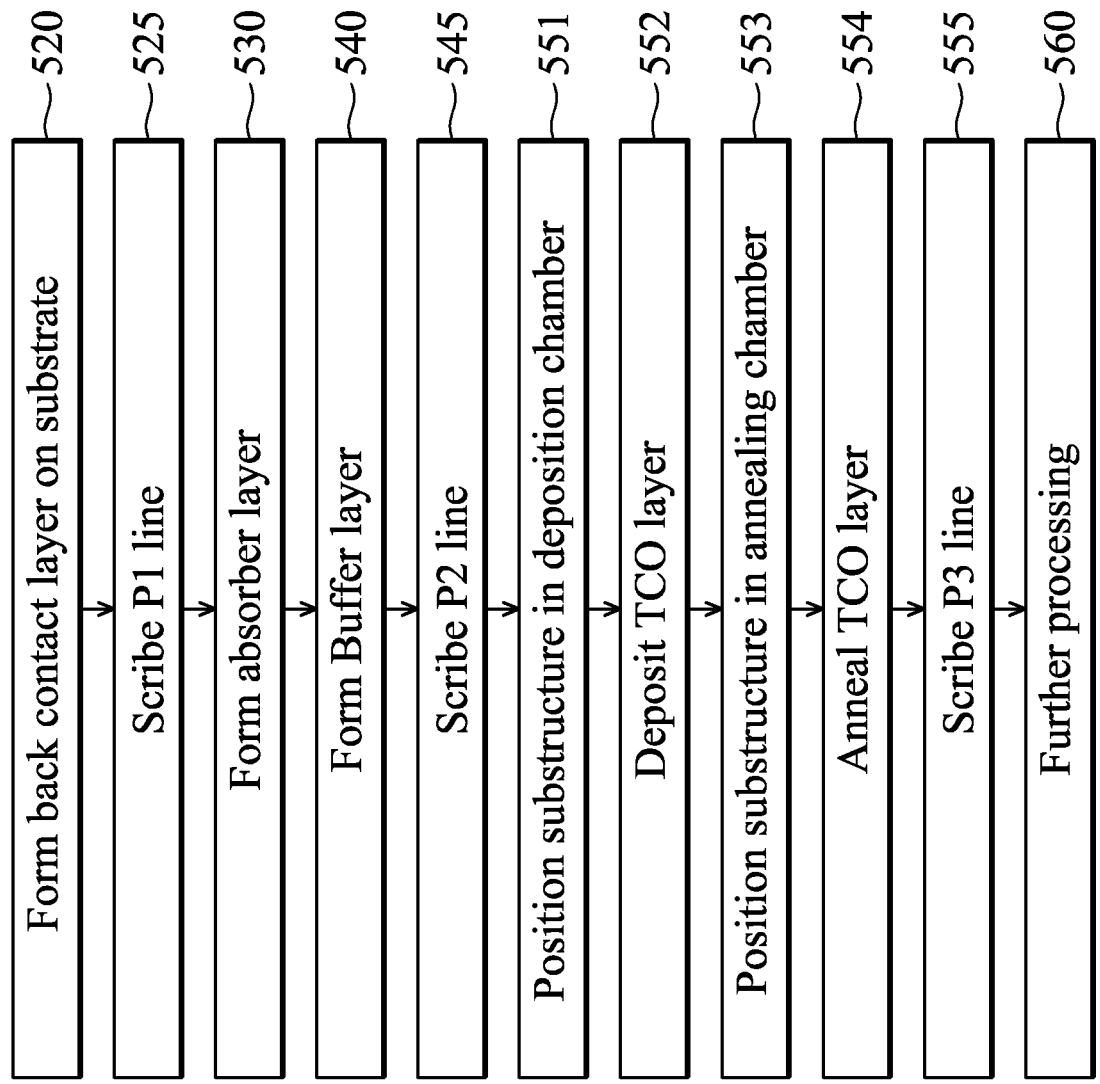
FIG. 5 is a flow chart of a method of fabricating a solar cell as shown and described herein.
Figure 6:
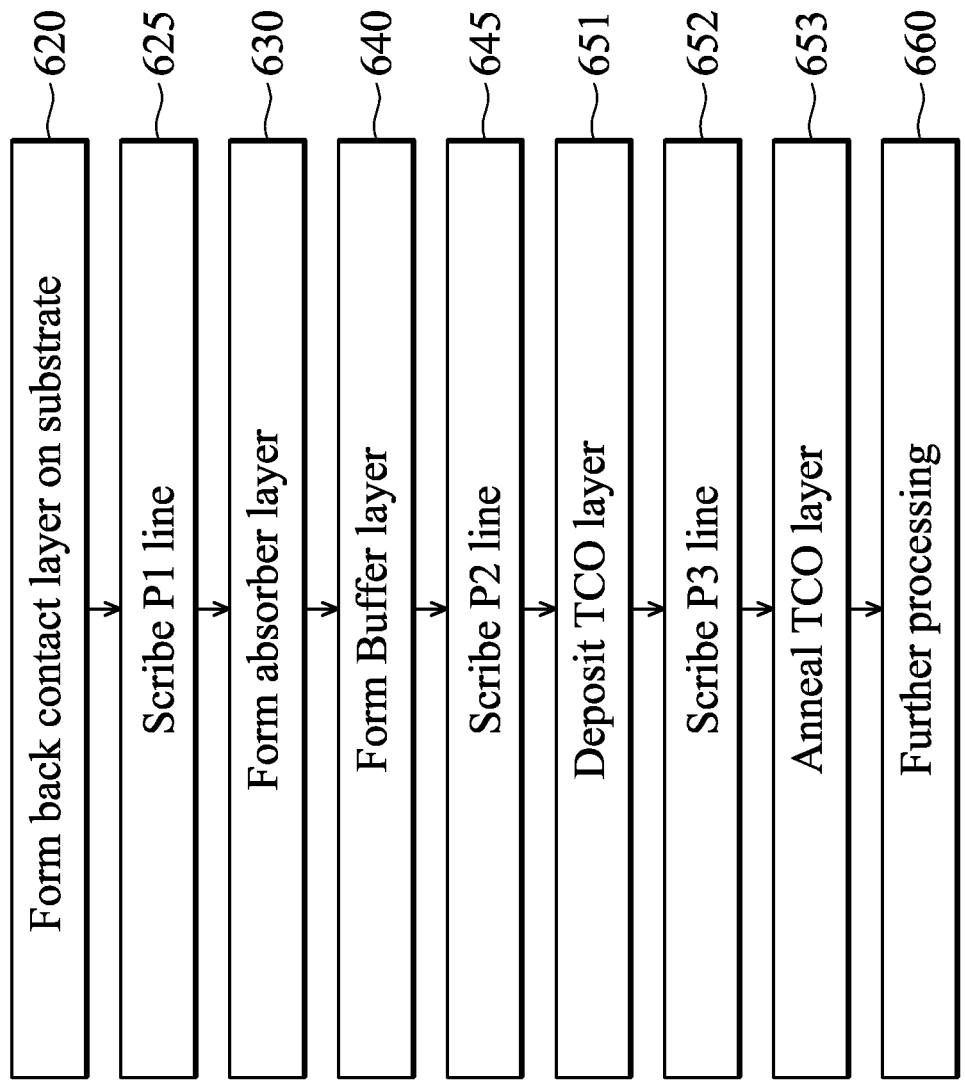
FIG. 6 is a flow chart of a method of fabricating a solar cell as shown and described herein.

FIGS. 4-6 show additional methods of fabrication of the improved solar cell device. Each includes a solar cell substructure including a back contact layer on a substrate, a P1 line through the back contact layer, an absorber layer on the back contact layer and filling the P1 line, a buffer layer on the absorber layer, and a P2 line through the buffer layer and the absorber layer. The substructure can be fabricated by forming the back contact layer on the substrate at steps 420/520/620, scribing the P1 line through the back contact layer at steps 425/525/625, forming the absorber layer on the back contact layer at steps 430/530/630, forming the buffer layer on the absorber layer at steps 440/540/640, and scribing the P2 line at steps 445/545/645. The method can include fabricating or otherwise providing the substructure, depositing a TCO layer over the buffer layer, annealing the deposited TCO layer, and scribing a P3 line though the TCO, buffer and absorber layers. The sequence of the fabrication can vary as shown in FIGS. 4-6 and described below.

Referring first to FIG. 4, in some embodiments the sequence can include: (a) positioning the substructure in a single in-line chamber at step 451; (b) depositing a TCO layer at step 452; (c) annealing the deposited TCO layer at step 453; and (d) scribing a P3 line at step 454. The depositing and annealing steps 452 and 453 can be performed in-line in the chamber. Referring next to FIG. 5, in some embodiments the sequence can include: (a) positioning the substructure in a deposition chamber at step 551; (b) depositing a TCO layer at step 552; (c) positioning the substructure in an annealing chamber at step 553; (d) annealing the deposited TCO layer at step 554; and (e) scribing a P3 line at step 555. Referring next to FIG. 6, in some embodiments the sequence can include: (a) depositing a TCO layer over the buffer layer of the substructure at step 651; (b) scribing a P3 line at step 652; and (c) annealing the deposited TCO layer at step 653. In a given sequence, each successive step (b)-(e) can be completed before the previous step (a)-(d). The devices can also undergo additional processing operations at steps 460/560/660.

EXAMPLE

Fabrication of Solar Cells

For comparison, solar cells were fabricated according to the methods described herein. A back contact of Mo was formed on a glass substrate by sputtering. A P1 interconnect line was scribed using a laser. An absorber layer of CIGS was formed on the back contact. Buffer layers of CdS or ZnS were formed on the absorber layer by chemical bath deposition. A P2 interconnect line was scribed using a mechanical scriber. A TCO layer of boron-doped ZnO (Zn:B) was formed above the buffer layer by MOCVD.

A first subset of the solar cells (S01) were completed according to a method without the annealing step the method including scribing a P3 interconnect line, ethylene vinyl acetate (EVA) and butyl applications, lamination, and other backend processes.

A second subset of the solar cells (S02) were completed according to the methods described above, with reference to FIGS. 2-6. In particular, the substructure was positioned in an annealing chamber including an upper infrared lamp as a heat source and the process pressure was lower than $1 \times 10^{-2}$ torr. The TCO layer was annealed. Following the annealing, the substructure was allowed to cool down naturally. A P3 interconnect line was scribed using a mechanical scriber. The S02 solar cells also underwent EVA and butyl applications, lamination, and other backend processes.

Comparison of Solar Cells

The electrical and optical properties of the S01 and S02 solar cells were compared. Exemplary measurements for resistance and transmittance of the S01 solar cells and the S02 solar cells according to the disclosure were as follows:

| Resistance (ohm/sq) | S01 | S02 | Transmittance | S01 | S02 |
|---|---|---|---|---|---|
| High | 19.53 | 16.27 | High | 80.1% | 80.1% |
| Low | 11.25 | 10.00 | Low | 79.1% | 79.1% |

Another representative measurement of total light transmittance in the 400-1200 nm range for the respective TCO layers was as follows:

| | S01 | S02 |
|---|---|---|
| TT % (400-1200 nm) | 80.05 | 80.25 |

Figure 7:
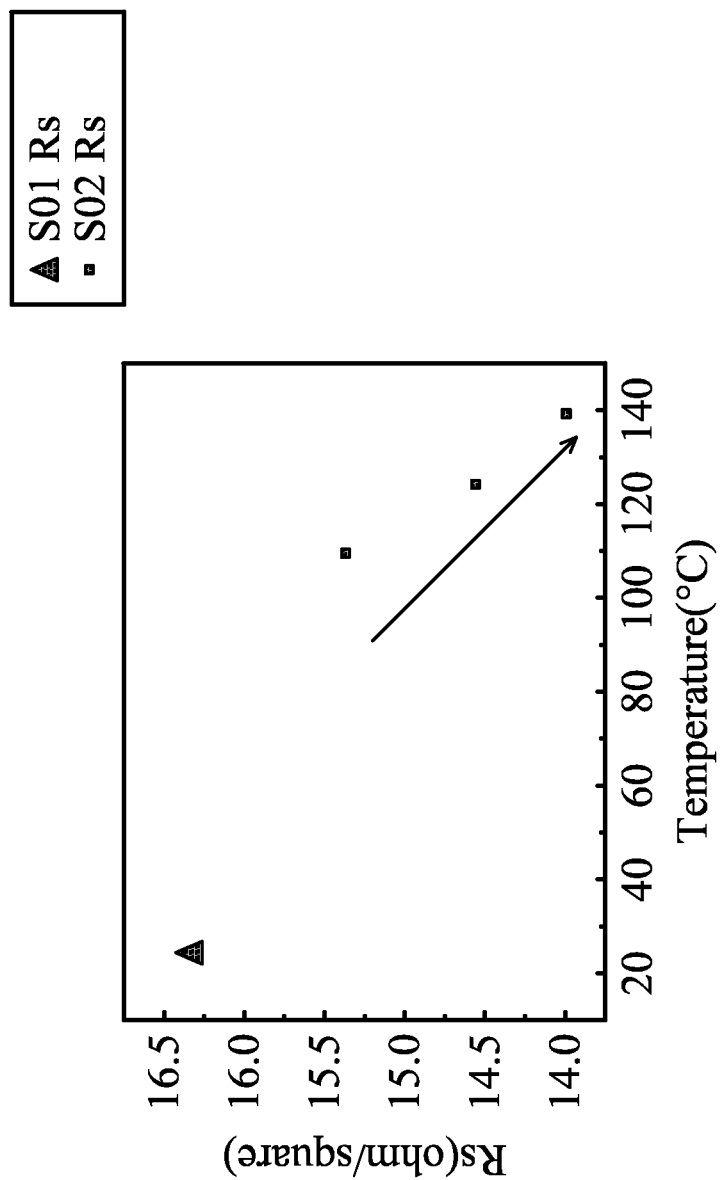
FIG. 7 is a chart showing data for resistance of solar cells described herein compared with a conventional device.

FIG. 7 is a chart showing representative data for sheet resistance (ohms per square) relative to annealing temperature. The chart includes a data point for the S01 devices at about room temperature (no annealing) and three data points for the S02 devices at various annealing temperatures. The S02 sheet resistance can be less than 16 ohms/sq, less than 15.5 ohms/sq, less than 14.75 ohms/sq, less than 14.25 ohms/sq, and less than 14 ohms/sq. The data indicates a decrease in sheet resistance with increasing temperature.

Figure 8:
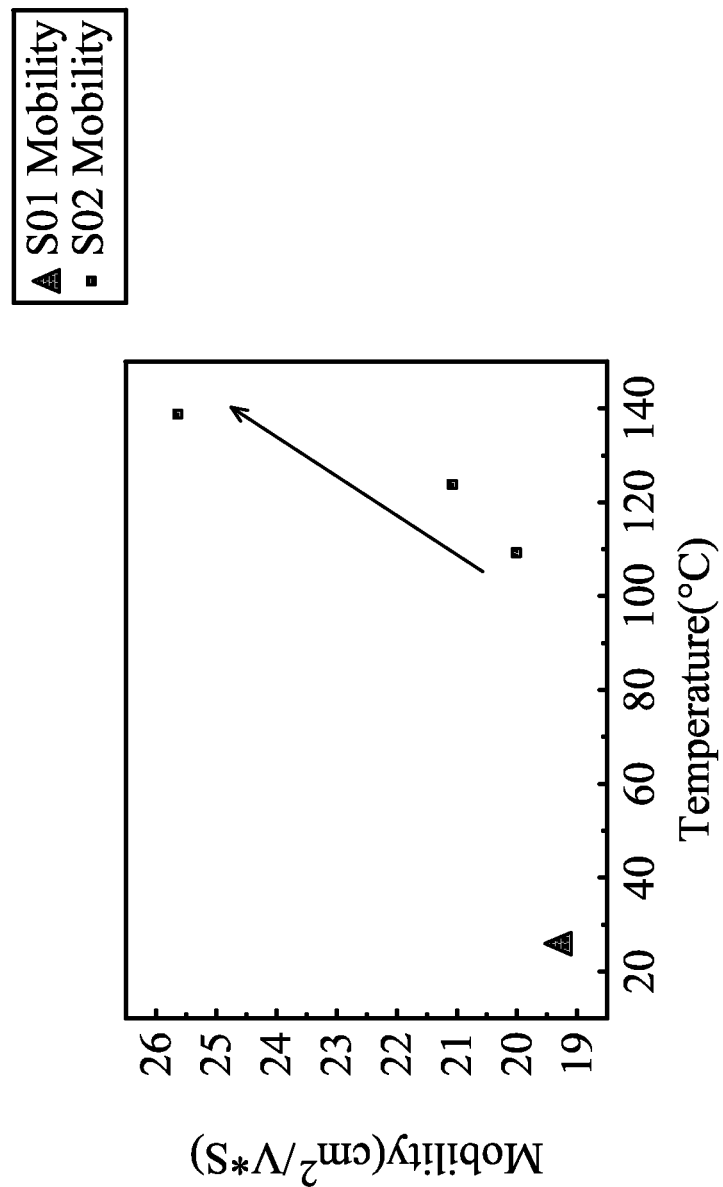
FIG. 8 a chart showing data for mobility of solar cells described herein compared with a conventional device.

FIG. 8 is a chart showing representative data for mobility ($cm^2$ per V*s) relative to annealing temperature. The chart includes a data point for the S01 devices at about room temperature (no annealing) and three data points for the S02 devices at various annealing temperatures. The S02 mobility can be greater than 19.5 $cm^2/Vs$, greater than 20.5 $cm^2/Vs$, greater than 25 $cm^2/Vs$, and greater than 25.5 $cm^2/Vs$. The data indicates an increase in mobility with temperature.

From this data, it is evident that the solar cells according to the method of FIGS. 2-6 (S02) have lower resistance and higher mobility over the (S01) solar cells, while maintaining a comparable transmittance. In summary, the disclosed method provides a highly compatible, controllable and stable method for fabricating solar cells and solar cell substructures with higher quality TCO films. The front contact layer according to the disclosure provides improved conductivity (i.e. lowered resistance) without degrading transmittance. Additionally, the efficient and effective methods also provide an improved device without increasing the cost or complexity of the fabrication process.

Although particular examples are described above, the structures and methods described herein can be applied to a broad variety of thin film solar cells, such as a-Si thin film, CIGS, and CdTe with pn junction, p-i-n stricture, MIS structure, multi-junction, and the like.

In some embodiments, a method for fabricating a solar cell is provided. The method can include forming a back contact layer on a substrate; forming an absorber layer on the back contact layer; forming a buffer layer on the absorber layer; depositing a transparent conductive oxide (TCO) layer above the buffer layer; and annealing the deposited TCO layer to provide a front contact layer.

In some embodiments, the depositing step includes depositing the TCO layer by chemical vapor deposition.

In some embodiments, the deposited TCO layer includes a doped metal oxide.

In some embodiments, the annealing step includes annealing the deposited TCO layer at a temperature in a range of about 60° C. to about 300° C.

In some embodiments, the annealing step includes annealing the deposited TCO layer at a temperature in a range of about 100° C. to about 200° C.

In some embodiments, the annealing step includes annealing the deposited TCO layer for a period of about 1 hour or less.

In some embodiments, the annealing step includes annealing the deposited TCO layer for a period of about 10 minutes or more.

In some embodiments, the annealing step includes positioning the solar cell in an annealing chamber.

In some embodiments, the depositing step includes positioning the solar cell in a deposition chamber.

In some embodiments, the depositing step and the annealing step are performed in a single in-line chamber.

In some embodiments, another method for fabricating a solar cell is provided. The method can include providing a substructure including a back contact layer on a substrate, a P1 line through the back contact layer, an absorber layer on the back contact layer and filling the P1 line, a buffer layer on the absorber layer, and a P2 line through the buffer layer and the absorber layer; depositing a transparent conductive oxide (TCO) layer over the buffer layer; annealing the deposited TCO layer; and scribing a P3 line through the TCO, buffer and absorber layers.

In some embodiments, the method further includes positioning the substructure in a single in-line chamber, and the steps of depositing the TCO layer and annealing the deposited TCO layer are both performed in the single in-line chamber.

In some embodiments, the method further includes (a) positioning the substructure in a deposition chamber before depositing the TCO layer, the TCO layer being deposited in the deposition chamber; and (b) positioning the substructure in an annealing chamber before the annealing step, the annealing being performed in the annealing chamber.

In some embodiments, the step of scribing the P3 line is performed before the annealing step.

In some embodiments, the depositing step includes depositing the TCO layer by chemical vapor deposition.

In some embodiments, a solar cell is provided. The solar cell can include a back contact layer; an absorber layer on the back contact layer; a buffer layer on the absorber layer; and a front contact layer above the buffer layer, the front contact layer including an annealed TCO layer.

In some embodiments, the annealed TCO layer includes a material selected from the group consisting of zinc oxide, indium oxide, indium tin oxide, and cadmium oxide.

In some embodiments, the annealed TCO layer includes a metal oxide material including dopants selected from the group consisting of aluminum, boron, tin, and indium.

In some embodiments, the annealed TCO layer has a transmittance of at least 80% at wavelengths from about 400 to about 1200 nm.

In some embodiments, the annealed TCO layer has a sheet resistance of about 15 ohms per square or less.

The descriptions of the fabrication techniques for exemplary embodiments may be performed using any suitable commercially available equipment commonly used in the art to manufacture solar cell devices, or alternatively, using future developed equipment and techniques.

The preceding merely illustrates the principles of the disclosure. It will thus be appreciated that those of ordinary skill in the art will be able to devise various arrangements which, although not explicitly described or shown herein, embody the principles of the disclosure and are included within its spirit and scope. Furthermore, all examples and conditional language recited herein are principally intended expressly to be only for pedagogical purposes and to aid the reader in understanding the principles of the disclosure and the concepts contributed by the inventors to furthering the art, and are to be construed as being without limitation to such specifically recited examples and conditions. Moreover, all statements herein reciting principles, aspects, and embodiments of the disclosure, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

Although the disclosure has been described in terms of exemplary embodiments, it is not limited thereto. Rather, the appended claims should be construed broadly, to include other variants and embodiments of the disclosure, which may be made by those of ordinary skill in the art without departing from the scope and range of equivalents of the disclosure.

What is claimed is:

1. A method for fabricating a solar cell, comprising:
    forming a back contact layer directly physically contacting a substrate, wherein the back contact layer comprises a metal;
    forming an absorber layer directly physically contacting the back contact layer;
    forming a buffer layer directly physically contacting the absorber layer; and
    depositing a transparent conductive oxide (TCO) layer directly physically contacting the buffer layer;
    annealing said deposited TCO layer in a vacuum environment to provide an annealed TCO front contact layer;
    scribing through the back contact layer to form a first scribe line, wherein the first scribe line is filled with material of the absorber layer and directly contacts the substrate;
    scribing through the buffer layer and the absorber layer to form a second scribe line, wherein the second scribe line is filled with material of the annealed TCO layer; and
    scribing through the annealed TCO front contact layer, the buffer layer, and the absorber layer after the annealing to form a third scribe line that exposes the back contact layer at an end of the third scribe line.

2. The method as in claim 1, wherein said depositing step comprises depositing said TCO layer by chemical vapor deposition.

3. The method as in claim 1, wherein said deposited TCO layer comprises a doped metal oxide.

4. The method as in claim 1, wherein said annealing step comprises annealing said deposited TCO layer at a temperature in a range of about 60° C. to about 300° C.

5. The method as in claim 1, wherein said annealing step comprises annealing said deposited TCO layer at a temperature in a range of about 100° C. to about 200° C.

6. The method as in claim 1, wherein said annealing step comprises annealing said deposited TCO layer for a period of about 1 hour or less.

7. The method as in claim 1, wherein said annealing step comprises annealing said deposited TCO layer for a period of about 10 minutes or more.

8. The method as in claim 1, wherein said annealing step is performed in an annealing chamber.

9. The method as in claim 8, wherein said depositing step is performed in a deposition chamber.

10. The method as in claim 1, wherein said depositing step and said annealing step are performed in a single in-line chamber.

11. The method as in claim 1, wherein said deposited TCO layer comprises a material selected from the group consisting of zinc oxide, indium oxide, indium tin oxide, and cadmium oxide.

12. The method as in claim 1, wherein said deposited TCO layer comprises a metal oxide material comprising dopants selected from the group consisting of aluminum, boron, tin, and indium.

13. The method as in claim 1, wherein said annealed TCO front contact layer has a transmittance of at least 80% at wavelengths from about 400 to about 1200 nm.

14. The method as in claim 1, wherein said annealed TCO front contact layer has a sheet resistance of less than 15 ohms per square.

15. The method as in claim 14, wherein said annealed TCO front contact layer has a transmittance of at least 80% at wavelengths from about 400 to about 1200 nm.

16. The method as in claim 1, wherein said annealing step comprises annealing said deposited TCO layer at a temperature in a range of about 80° C. to about 150° C.

17. The method as in claim 1, wherein said annealing step is performed under the vacuum environment at a temperature in a range of about 80° C. to about 150° C. for a period of about 30 minutes to about 1 hour.

18. A method for fabricating a solar cell, comprising:
forming a back contact layer directly physically contacting a substrate, wherein the back contact layer comprises a metal;
forming an absorber layer directly physically contacting the back contact layer;
forming a buffer layer directly physically contacting the absorber layer; and
depositing a transparent conductive oxide (TCO) layer to directly physically contact the buffer layer;
annealing said deposited TCO layer in a vacuum environment at a temperature in a range of about 80° C. to about 150° C. for a period of about 30 minutes to about 1 hour to provide an annealed TCO front contact layer;
scribing through the back contact layer to form a first scribe line, wherein the first scribe line is filled with material of the absorber layer and directly contacts the substrate;
scribing through the buffer layer and the absorber layer to form a second scribe line, wherein the second scribe line is filled with material of the annealed TCO layer; and
scribing through the annealed TCO front contact layer, the buffer layer, and the absorber layer after the annealing to form a third scribe line that exposes the back contact layer at an end of the third scribe line.

19. A method for fabricating a solar cell, comprising:
forming a back contact layer directly physically contacting a substrate, wherein the back contact layer comprises a metal;
forming an absorber layer directly physically contacting the back contact layer;
forming a buffer layer directly physically contacting the absorber layer; and
depositing a transparent conductive oxide (TCO) layer to directly physically contact the buffer layer;
scribing through the back contact layer to form a first scribe line, wherein the first scribe line is filled with material of the absorber layer and directly contacts the substrate;
scribing through the buffer layer and the absorber layer to form a second scribe line, wherein the second scribe line is filled with material of the TCO layer; and
scribing through the TCO front contact layer, the buffer layer, and the absorber layer to form a third scribe line that exposes the back contact layer at an end of the third scribe line.

20. The method of claim 19, further comprising annealing said deposited TCO layer in a vacuum environment at a temperature in a range of about 80° C. to about 150° C. for a period of about 30 minutes to about 1 hour to provide an annealed TCO front contact layer.

* * * * *